US012645137B2

(12) United States Patent
Sugiyama et al.

(10) Patent No.: US 12,645,137 B2
(45) Date of Patent: Jun. 2, 2026

(54) MASK BLANKS SUBSTRATE AND METHOD FOR MANUFACTURING THE SAME

(71) Applicant: Shin-Etsu Chemical Co., Ltd., Tokyo (JP)

(72) Inventors: Tomoaki Sugiyama, Joetsu (JP); Daijitsu Harada, Joetsu (JP); Harunobu Matsui, Joetsu (JP); Naoki Yarita, Joetsu (JP); Masaki Takeuchi, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 455 days.

(21) Appl. No.: 17/856,191

(22) Filed: Jul. 1, 2022

(65) Prior Publication Data

US 2023/0037856 A1 Feb. 9, 2023

(30) Foreign Application Priority Data

Jul. 21, 2021 (JP) ................................. 2021-120239

(51) Int. Cl.
*G03F 1/60* (2012.01)
*G03F 1/68* (2012.01)
(Continued)

(52) U.S. Cl.
CPC ................. *G03F 1/60* (2013.01); *G03F 1/68* (2013.01); *G03F 1/82* (2013.01); *G03F 1/84* (2013.01)

(58) Field of Classification Search
None
See application file for complete search history.

(56) References Cited

U.S. PATENT DOCUMENTS

2003/0186624 A1* 10/2003 Koike .................... B24B 49/04
430/311
2007/0059608 A1* 3/2007 Ikuta ...................... G03F 7/707
716/51
(Continued)

FOREIGN PATENT DOCUMENTS

JP 2003-50458 A 2/2003
JP 2010-194705 A 9/2010
(Continued)

OTHER PUBLICATIONS

Extended European Search Report for European Application No. 22184186.9, dated Dec. 15, 2022.
(Continued)

*Primary Examiner* — Martin J Angebranndt
(74) *Attorney, Agent, or Firm* — Birch, Stewart, Kolasch & Birch, LLP

(57) ABSTRACT

A mask blanks substrate having a flatness of a calculation surface of 100 nm or less when a calculation region passing through central portions of first and second main surfaces and extending in a horizontal direction is set, a first region surface is cut out, a second region surface is cut out by setting a reference plane and a rotation axis and rotating the substrate by 180°, least square planes are calculated, the first and second region surfaces are converted into height maps to positions on the least square planes, the height map of the to second region surface is set as a reverse height map by symmetrically moving the height map, and a map of a calculated height obtained by adding heights of the height map of the first region surface and the reverse height map of the second region surface is set as the calculation surface.

8 Claims, 5 Drawing Sheets

LOCAL PROCESSED SHAPE

PREDICTED SHAPE

SHAPE AFTER FINISH PROCESSING

FIRST MAIN SURFACE

SECOND MAIN SURFACE

-0.1 – -0.05 -0.05 – 0 0 – 0.05 0.05 – 0.1

(51) Int. Cl.
    *G03F 1/82*        (2012.01)
    *G03F 1/84*        (2012.01)

(56)           References Cited

U.S. PATENT DOCUMENTS

| | | | | |
|---|---|---|---|---|
| 2008/0032213 A1 * | 2/2008 | Kikugawa | C03C 3/06 | |
| | | | 430/5 | |
| 2010/0190414 A1 | 7/2010 | Harada et al. | | |
| 2011/0143267 A1 * | 6/2011 | Harada | G03F 1/60 | |
| | | | 430/5 | |
| 2011/0172982 A1 | 7/2011 | Veeraraghavan et al. | | |
| 2013/0236085 A1 * | 9/2013 | Chen | G06T 7/0004 | |
| | | | 382/145 | |
| 2017/0363952 A1 | 12/2017 | Ikebe et al. | | |
| 2018/0239236 A1 * | 8/2018 | Okamura | G03F 1/54 | |
| 2021/0132487 A1 * | 5/2021 | Shin | G03F 1/48 | |
| 2023/0418149 A1 * | 12/2023 | Sugiyama | G03F 1/22 | |

FOREIGN PATENT DOCUMENTS

| | | | | | | |
|---|---|---|---|---|---|---|
| JP | 2013-527972 | A | | 7/2013 | | |
| JP | 2015064477 | A | * | 4/2015 | | |
| JP | 2016004821 | A | * | 1/2016 | | |
| JP | 2017129848 | A | * | 7/2017 | | G03F 1/50 |
| JP | 2017-181807 | A | | 9/2017 | | |
| JP | 2017181731 | A | * | 10/2017 | | |
| JP | 2018054960 | A | * | 4/2018 | | |
| JP | 2019214111 | A | * | 12/2019 | | |
| JP | 2020106721 | A | * | 7/2020 | | |
| KR | 20060109051 | A | * | 10/2006 | | H01L 21/68 |
| KR | 2017021191 | A | * | 2/2017 | | G03F 1/22 |
| WO | WO-2012102313 | A1 | * | 8/2012 | | G03F 1/24 |
| WO | WO 2016/098452 | A1 | | 6/2016 | | |

OTHER PUBLICATIONS

Japanese Office Action for Japanese Application No. 2022-097176, dated Mar. 4, 2025, with English translation.

\* cited by examiner

MASK BLANKS SUBSTRATE AND METHOD FOR MANUFACTURING THE SAME

CROSS-REFERENCE TO RELATED APPLICATION

This non-provisional application claims priority under 35 U.S.C. § 119(a) on Patent Application No. 2021-120239 filed in Japan on Jul. 21, 2021, the entire contents of which are hereby incorporated by reference.

TECHNICAL FIELD

The present invention relates to a mask blanks substrate used for photolithography and a method for manufacturing the same, and more particularly to a mask blanks substrate suitable for mask blanks used for manufacturing a transfer mask for photolithography in which extreme ultra violet (EUV) light is used for exposure light and a method for manufacturing the same.

BACKGROUND ART

In recent years, as AI and IoT attract attention, arithmetic processing of enormous data is required, and accordingly, high-speed arithmetic processing and power saving are required. In order to meet this demand, it is necessary to improve the performance of an IC chip, and in general, miniaturization of electrical wiring is adopted as an effective means. For miniaturization of wirings, an increase in NA, shorter wavelength of exposure light, or the like are mainly adopted, but in recent years, EUV lithography (EUVL) using extreme ultraviolet (EUV) light is being put into practical use.

In EUVL, an exposure mask is one of important elements, and it is extremely important to improve flatness of a glass substrate for original plates (mask blanks) of the exposure mask in order to realize accurate exposure. As a normal method for manufacturing a glass substrate, double-sided simultaneous polishing is mainly used, but by only double-sided simultaneous polishing, flatness that is good enough to be used for EUVL cannot be obtained. In order to realize high flatness, it is necessary to correct the flatness according to the surface shape by polishing one surface at a time, and a local processing technique such as local etching or local processing is used. These are methods in which the entire substrate is made flat by removing the relatively convex region.

Even if a glass substrate with high flatness on both surfaces can be obtained in this manner, the surface (back surface) of the exposure mask without the pattern is adsorbed and held on the mask stage of the exposure apparatus at the time of exposure, in a manner that the surface shape of the surface (from surface) with the pattern is deformed according to the surface shape of the back surface, and as a result, the flatness of the surface (front surface) with the pattern changes. Therefore, not only the flatness of each of the front and back surfaces of the glass substrate of the exposure mask before adsorption at the time of exposure, but also the flatness of the surface of the glass substrate of the exposure mask after adsorption at the time of exposure is important.

With respect to the flatness in a state where the exposure mask is adsorbed and held on the mask stage of the exposure apparatus, for example, WO 2016/098452 (Patent Document 1) discloses, in order to obtain high transfer accuracy when a reflective mask prepared using a substrate obtained by performing conventional double-sided polishing and local processing on both front and back main surfaces is chucked to the exposure apparatus and exposure transfer is performed, if the shape of the front main surface of the substrate when being electrostatically chucked is brought close to a shape (virtual surface shape) that can be defined by a Zemike polynomial correctable by a wavefront correction function of the exposure apparatus, even if the substrate has a plate thickness variation that influences a change in the shape of the front main surface, the plate thickness variation can be easily corrected by the wavefront correction function of the exposure apparatus, and a transfer mask having such a substrate can perform exposure transfer of a transfer pattern to an object subjected to transfer with high accuracy.

in addition, JP-A 2003-050458 (Patent Document 2) indicates that when a mask substrate is chucked to a mask stage of an exposure apparatus, the deterioration in flatness after chucking becomes a major factor of the decrease in product yield, and as a method for improving this, discloses a method for manufacturing an exposure mask including a step of acquiring, for each of a plurality of mask substrates, first information indicating a surface shape of a main surface and second information indicating flatness of the main surface before and after chucking to the mask stage of the exposure apparatus, a step of creating a correspondence relationship between each of the mask substrates and the first information and the second information, and a step of selecting second information indicating desired flatness from the created correspondence relationship, and preparing a mask substrate having the same surface shape as the surface shape indicated by the first information having a corresponding relationship with the selected second information separately from the plurality of mask substrates, and a step of forming a desired pattern on the prepared mask substrate. As a result, it is possible to suppress a decrease in product yield due to deterioration of flatness.

CITATION LIST

Patent Document 1: WO 2016/098452
Patent Document 2: JP-A 2003-050458
Patent Document 3: JP-A 2010-194705

SUMMARY OF THE INVENTION

The method described in WO 2016/098452 A includes a step of calculating a synthesis plane of a front main surface and a back main surface at the time of adsorption to an exposure apparatus and a step of predicting a surface shape after optical correction from a shape obtained by fitting the synthesis plane with a Zernike polynomial. However, this method defines flatness in a circular region having a diameter of 104 mm, which is narrower and insufficient than a region actually used for exposure (132 mm square). In addition, in general, it is known that flatness tends to deteriorate toward the outer periphery of the main surface, and from this point, a high-quality glass substrate for mask blanks cannot be obtained by this method. Furthermore, the surface shape at the time of exposure calculated in the step of calculating the synthesis plane is a simple sum of the front main surface and the back main surface, and is highly likely to deviate from the actual surface shape, and high prediction accuracy cannot be obtained in the step of predicting the surface shape after optical correction.

In addition, in the method described in JP-A 2003-050458, it is shown that there is a directional difference in flatness depending on the chuck position of the substrate, but in the technical level currently required for EUVL, it is necessary to further control flatness, and it is not sufficient to manage flatness.

The present invention has been made in view of the above circumstances, and an object of the present invention is to provide a mask blanks substrate that provides an exposure mask in which a main surface of the substrate has a highly flat shape as a shape not subjected to optical correction when the exposure mask is held by adsorption on an exposure machine in exposure using the exposure mask, particularly exposure by EUVL, and a method for manufacturing the same.

As a result of intensive studies to solve the above problems, the present inventors have found that a mask blanks substrate having a flatness (TIR) of a calculation surface of 100 nm or less will provide an exposure mask in which a main surface of the substrate has a highly flat shape when the exposure mask is held by adsorption to an exposure machine in exposure using the exposure mask, particularly exposure by EUVL, when a predetermined calculation region for two main surfaces of a first main surface and a second main surface of a mask blanks substrate is set, a first region surface and a second region surface are cut out in the calculation region, least square planes of the first region surface and the second region surface are calculated, the first region surface and the second region surface are converted into height maps of the first region surface and the second region surface from the respective least square planes, and a map of a calculated height obtained by adding a height of the height map of the first region surface and a height of a reverse height map obtained by plane-symmetrically moving the height map of the second region surface at each position on a reference plane set based on the calculation region.

In addition, the present inventors have found that such a mask blanks substrate can be reliably and productively manufactured by applying a change in the shape of the main surface grasped in advance to the shape of the main surface before the finish polishing step after the local processing step in a manufacturing method including the local processing step and the finish polishing step subsequent to the local processing step, predicting the shape of the main surface after the finish polishing step, and evaluating whether or not the predicted shape of the main surface satisfies a predetermined flatness, completing the present invention.

Therefore, the present invention provides the following mask blanks substrate and a method for manufacturing the mask blanks substrate.

1. A mask blanks substrate having two main surfaces of a first main surface and a second main surface of 152 mm×152 mm square and having a thickness of 6.35 mm, wherein
    a flatness (TIR) of a calculation surface is 100 nm or less when
    (1) the first main surface and the second main surface of the substrate are arranged along a substantially vertical direction and a calculation region of a regular square cylindrical shape extending in a horizontal direction through four sides of a 138 mm×138 mm square along four sides of the first main surface and the second main surface is set in a central portion of the first main surface and the second main surface,
    (2) a portion in the calculation region is cut out from the first main surface in a state of facing the first main surface to obtain a first region surface,
    (3) a vertical plane passing through a reference point that is an arbitrary point on a central axis of a regular square cylinder of the calculation region and orthogonal to the central axis is set as a reference plane, a rotation axis passing through the reference point and parallel to any one side of four sides of a regular square that is an intersection line between the regular square cylinder of the calculation region and the vertical plane is set, and a portion in the calculation region is cut out from the second main surface in a state of facing the second main surface by rotating the substrate 180 degrees along the rotation axis from a state of facing the first main surface, to obtain a second region surface,
    (4) a least square plane in each of the first region surface and the second region surface is calculated,
    (5) the first region surface and the second region surface are converted into a height map of the first region surface and a height map of the second region surface with respect to respective positions of the first region surface and the second region surface on a least square plane,
    (6) the height map of the second region surface is set as a reverse height map of the second region surface by symmetrically moving the height map with respect to a perpendicular plane passing through the rotation axis and along a 90 degree direction of the rotation, and
    (7) a map of a calculated height (Z coordinate) is created by adding a height of the height map of the first region surface and a height of the reverse height map of the second region surface at each position (X coordinate and Y coordinate) on the reference plane, and the map of the calculated height is set as the calculation surface.

2. The mask blanks substrate according to 1, wherein in the (5), as the height map of the second region surface, a height map obtained by processing with a Gaussian filter (20 mm×20 mm) is applied.

3. The mask blanks substrate according to 1, wherein in the (5), as the height map of the second region surface, a height map obtained by fitting with terms up to a 15th order of a Legendre polynomial is applied.

4. A method for manufacturing a mask blanks substrate having two main surfaces of a, first main surface and a second main surface of 152 mm×152 mm square and having a thickness of 6.35 mm, the method comprising:
    a local processing step for one or both of the first main surface and the second main surface, and a finish polishing step subsequent to the local processing step,
    the local processing step includes
    (A) a step of grasping a change in shapes of the surfaces before and after the finish polishing step of the first main surface and the second main surface,
    (B) a step of locally processing one or both of the first main surface and the second main surface,
    (C) a step of measuring the shape of the first main surface and the shape of the second main surface after the step (B) as the shape of the surfaces before the finish polishing step,
    (D) a step of predicting the shapes of the first main surface and the second main surface after the finish polishing step by applying the change in the shapes of the surfaces grasped in the step (A) to the shapes of the surfaces before the finish polishing step obtained in the step (C), and
    (E) a step of evaluating whether or not the shapes of the first main surface and the second main surface predicted in the step (D) are shapes of the first main surface and the second main surface satisfying predetermined flatness.

5

6

5. The manufacturing method according to 4 having the flatness (TIR) of the calculation surface is 100 nm or less, wherein the shapes of the first main surface and the second main surface satisfying the predetermined flatness in the step (E) are (1) the first main surface and the second main surface of the substrate are arranged along a substantially vertical direction and a calculation region of a regular square cylindrical shape extending in a horizontal direction through four sides of a 138 mm×138 mm square along four sides of the first main surface and the second main surface is set in a central portion of the first main surface and the second main surface, (2) a portion in the calculation region is cut out from the first main surface in a state of facing the first main surface to obtain a first region surface, (3) a vertical plane passing through a reference point that is an arbitrary point on a central axis of a regular square cylinder of the calculation region and orthogonal to the central axis is set as a reference plane, a rotation axis passing through the reference point and parallel to any one side of four sides of a regular square that is an intersection line between the regular square cylinder of the calculation region and the vertical plane is set, and a portion in the calculation region is cut out from the second main surface in a state of facing the second main surface by rotating the substrate 180 degrees along the rotation axis from a state of facing the first main surface, to obtain a second region surface, (4) a least square plane in each of the first region surface and the second region surface is calculated, (5) the first region surface and the second region surface are converted into a height map of the first region surface and a height map of the second region surface with respect to respective positions of the first region surface and the second region surface on a least square plane, (6) the height map of the second region surface is set as a reverse height map of the second region surface by symmetrically moving the height map with respect to a perpendicular plane passing through the rotation axis and along a 90 degree direction of the rotation, and (7) a map of a calculated height (Z coordinate) is created by adding a height of the height map of the first region surface and a height of the reverse height map of the second region surface at each position (X coordinate and Y coordinate) on the reference plane, and the map of the calculated height is set as the calculation surface.

6. The manufacturing method according to 5, wherein in the (5), as the height map of the second region surface, a height map obtained by processing with a Gaussian filter (20 mm×20 mm) is applied.

7. The manufacturing method according to 5, wherein in the (5), as the height map of the second region surface, a height map obtained by fitting with terms up to a 15th order of a Legendre polynomial is applied.

8. The manufacturing method according to any one of 4 to 7, wherein in the step (F), in a case where the shapes of the first main surface and the second main surface predicted in the step (D) are not the shapes of the first main surface and the second main surface satisfying the predetermined flatness, the steps (A) to (E) are repeated.

ADVANTAGEOUS EFFECTS OF THE INVENTION

The mask blanks substrate of the present invention can provide an exposure mask in which a main surface of the substrate has a highly flat shape when the exposure mask is held by adsorption on an exposure machine in exposure using the exposure mask, particularly, exposure by EUVL. In addition, according to the method for manufacturing a mask blanks substrate of the present invention, by predicting the shape of the main surface after the finish polishing step and performing local processing, it is possible to reliably and productively manufacture a mask blanks substrate that provides an exposure mask in which the main surface of the substrate has a highly flat shape when the exposure mask is held by adsorption on an exposure machine in exposure using the exposure mask, in particular, exposure using EUVL.

BRIEF DESCRIPTION OF THE DRAWINGS

FIG. 1A is a side view of a state in which a first main surface and a second main surface of the mask blanks substrate are arranged along a vertical direction, and FIG. 1B is a front view of the first main surface located on a right side in FIG. 1A;

FIG. 2A is a side view of the mask blanks substrate after rotation by 180 degrees, and FIG. 2B is a front view of the second main surface located on the fight side in FIG. 2A after rotation;

FIGS. 3A to 3C are views for explaining an aspect of the mask blanks substrate of the present invention, and FIGS. 3A to 3C are a height map of a first region surface, a height map of a second region surface, and a reverse height map of the second region surface, respectively;

DESCRIPTION OF THE PREFERRED EMBODIMENT

Figure 1A:
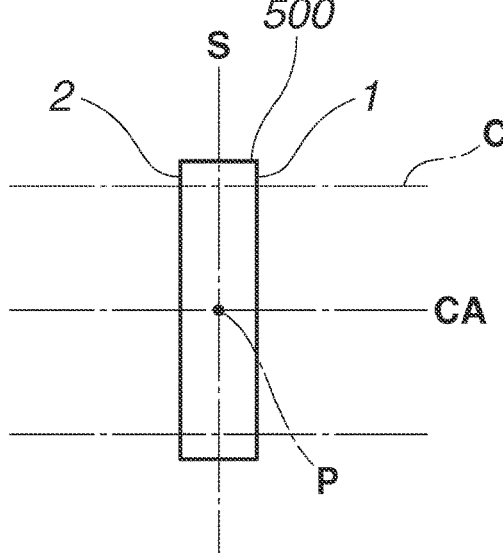
FIGS. 1A and 1B are views for explaining an aspect of a mask blanks substrate of the present invention.

Hereinafter, the present invention is described in detail.

The mask blanks substrate of the present invention has two main surfaces of a first main surface and a second main surface of 152 mm×152 mm square, and has a thickness of 6.35 mm. The substrate of this size is referred to as a so-called 6025 substrate, and is a substrate having two main surfaces of a first main surface and a second main surface of 6 inches×6 inches square and having a thickness of 0.25 inches.

As a material of the mask blanks substrate of the present invention, a conventionally used material can be used, and is not particularly limited. However, $TiO_2$-doped quartz glass containing $TiO_2$ at 3 to 10 wt %, which has very high dimensional stability at high temperature, is suitably used because the substrate is exposed to high-energy exposure light for drawing a fine pattern. As the raw material substrate of the mask blanks substrate, a substrate synthesized, molded, and processed according to a conventional method can be used.

A mask blanks substrate is required to have high flatness. This is because the higher the flatness, the easier the target exposure is achieved, and it can be said that a substrate having a higher flatness is a mask blanks substrate suitable for drawing a fine pattern.

The mask blanks substrate includes the first main surface on which an exposure pattern (such as a wiring pattern) is formed when used as an exposure mask and the second main surface on which no exposure pattern is formed, and the second main surface is adsorbed to and held by an exposure machine. Since the second main surface is deformed along the adsorption surface, the shape of the first main surface used for exposure is also deformed accordingly. At the previous required level, deterioration of flatness due to adsorption of the exposure machine is allowed to some extent, and there are many cases where there is no problem even if the flatness of the second main surface is larger than the flatness of the first main surface by about one digit. Therefore, it has been the mainstream to polish the two main surfaces by double-sided simultaneous polishing in which the flatness of one of the two main surfaces becomes large, and to use the main surface having the larger flatness as the second main surface.

However, in recent years, in order to realize an extremely fine pattern, the same degree of flatness is required for both surfaces of the two main surfaces, and therefore, a local processing technique of separately processing each surface of the two main surfaces has been proposed. Furthermore, even if both surfaces of the two main surfaces are highly flat, it has been found that sufficient flatness cannot be obtained when the exposure mask is held by adsorption on the exposure machine depending on the shape of the second main surface, and in a state-of-the-art product for realizing an extremely fine pattern, it is important to obtain high flatness when the exposure mask is held by adsorption on the exposure machine.

It is extremely important to evaluate the shape of the main surface when the mask is used as an exposure mask from the mask blanks substrate through the mask blanks and the exposure mask is held by adsorption on an exposure machine, but in general, it is difficult to directly measure the shape. Therefore, the shape of the main surface when the exposure mask is adsorbed and held by the exposure machine is estimated, for example, approximately calculated from the shape of the main surface measured by a general laser interferometer. However, in the related art, it has not been possible to accurately grasp the flatness when the exposure mask is adsorbed and held by the exposure machine in the region necessary for exposure, and thus, a mask blanks substrate that provides sufficient flatness when the exposure mask is adsorbed and held by the exposure machine has not been obtained.

In the mask blanks substrate of the present invention, a flatness (TIR) of a calculation surface obtained by superimposing surface shapes of two main surfaces located inside a square of 138 mm×138 mm with respect to a center of the substrate and within a calculation region of a regular square cylindrical shape extending in a thickness direction of the substrate is 100 nm or less. Specifically, the mask blanks substrate according to the present invention has a flatness (TIR) of a calculation surface is 100 nm or less when (1) the first main surface and the second main surface of the substrate are arranged along a substantially vertical direction and a calculation region of a regular square cylindrical shape extending in a horizontal direction through four sides of a 138 mm×138 mm square along, four sides of the first main surface and the second main surface is set in a central portion of the first main surface and the second main surface, (2) a portion in the calculation region is cut out from the first main surface in a state of facing the first main surface to obtain a first region surface, (3) a vertical plane passing through a reference point that is an arbitrary point on a central axis of a regular square cylinder of the calculation region and orthogonal to the central axis is set as a reference plane, a rotation axis passing through the reference point and parallel to any one side of four sides of a regular square that is an intersection line between the regular square cylinder of the calculation region and the vertical plane is set, and a portion in the calculation region is cut out from the second main surface in a state of facing the second main surface by rotating the substrate 180 degrees along the rotation axis from a state of facing the first main surface, to obtain a second region surface, (4) a least square plane in each of the first region surface and the second region surface is calculated, (5) the first region surface and the second region surface are converted into a height map of the first region surface and a height map of the second region surface with respect to respective positions of the first region surface and the second region surface on a least square plane, (6) the height map of the second region surface is set as a reverse height map of the second region surface by symmetrically moving the height map with respect to a perpendicular plane along a 90 degree direction of the rotation in (3) passing through the rotation axis in (3), and (7) a map of a calculated height (Z coordinate) is created by adding a height of the height map of the first region surface and a height of the reverse height map of the second region surface at each position (X coordinate and Y coordinate) on the reference plane, and the map of the calculated height is set as the calculation surface.

Figure 1B:
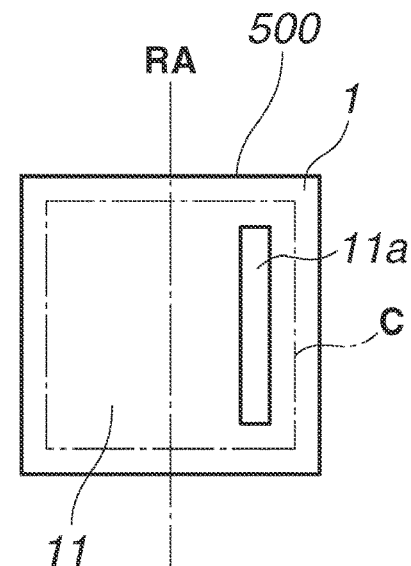

The above (1) to (7) are specifically described with reference to FIGS. 1A to 4 for explaining an aspect of the mask blanks substrate of the present invention. First, in FIGS. 1A and 1B, FIG. 1A is a side view of a state in which a first main surface and a second main surface of the mask blanks substrate are arranged along a vertical direction, and FIG. 1B is a front view of the first main surface located on a right side in FIG. 1A. In (1), as illustrated in FIG. 1A, a first main surface 1 and a second main surface 2 of a 152 mm×152 mm square of a substrate 500 are arranged substantially along the vertical direction, and a calculation region C of a regular square cylindrical shape extending in the horizontal direction through four sides of a square of 138 mm×138 mm along four sides of the first main surface 1 and the second main surface 2 is set in a central portion of the first main surface 1 and the second main surface 2.

Next, in (2), as illustrated in FIG. 1B, a portion in the calculation region C is cut out from the first main surface 1 in a state of facing the first main surface 1 to obtain a first region surface 11. In addition, here, for convenience, it is assumed that a convex portion 11a exists on the first main surface 1, and a convex portion 21a also exists on the second main surface 2 as illustrated in FIG. 2B described later.

Next, in (3), as illustrated in FIGS. 1A and 1B, a vertical plane that passes through a reference point P, which is an arbitrary one point on a central axis CA of the regular square cylinder of the calculation region C and is orthogonal to the central axis CA, is set as a reference plane S (here, the reference plane S is a plane extending in the depth direction of the drawing), and a rotation axis RA that passes through the reference point P and is parallel to any one side of four sides of the regular square that is an intersection line between the regular square cylinder of the calculation region C and the vertical plane is set. Then, the substrate 500 is rotated by 180 degrees along the rotation axis RA (around the rotation axis RA) from the state of facing the first main surface 1.

Figure 2A:
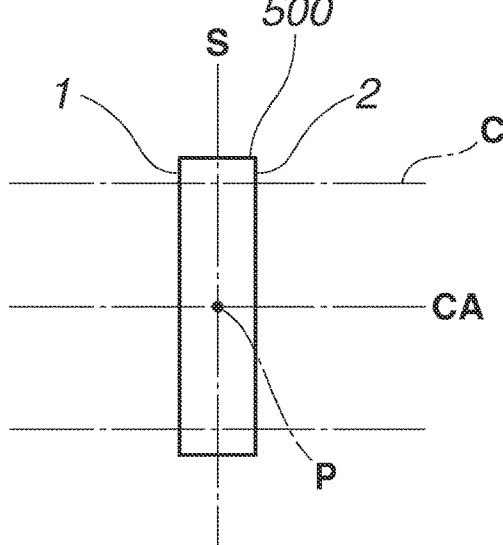
FIGS. 2A and 2B are views for explaining an aspect of the mask blanks substrate of the present invention.
Figure 2B:
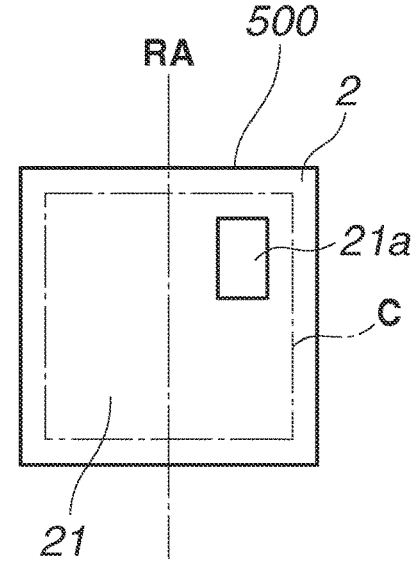

On the other hand, in FIGS. 2A and 2B, FIG. 2A is a side view of the mask blanks substrate after rotation by 180 degrees, and FIG. 2B is a front view of the second main surface located on the right side in FIG. 2A after rotation. After the rotation of the substrate 500, as illustrated in FIG. 2B, a portion in the calculation region C is cut out from the second main surface 2 in a state of facing the second main surface 2 to obtain a second region surface 21.

Figures 3A, 3B, 3C:
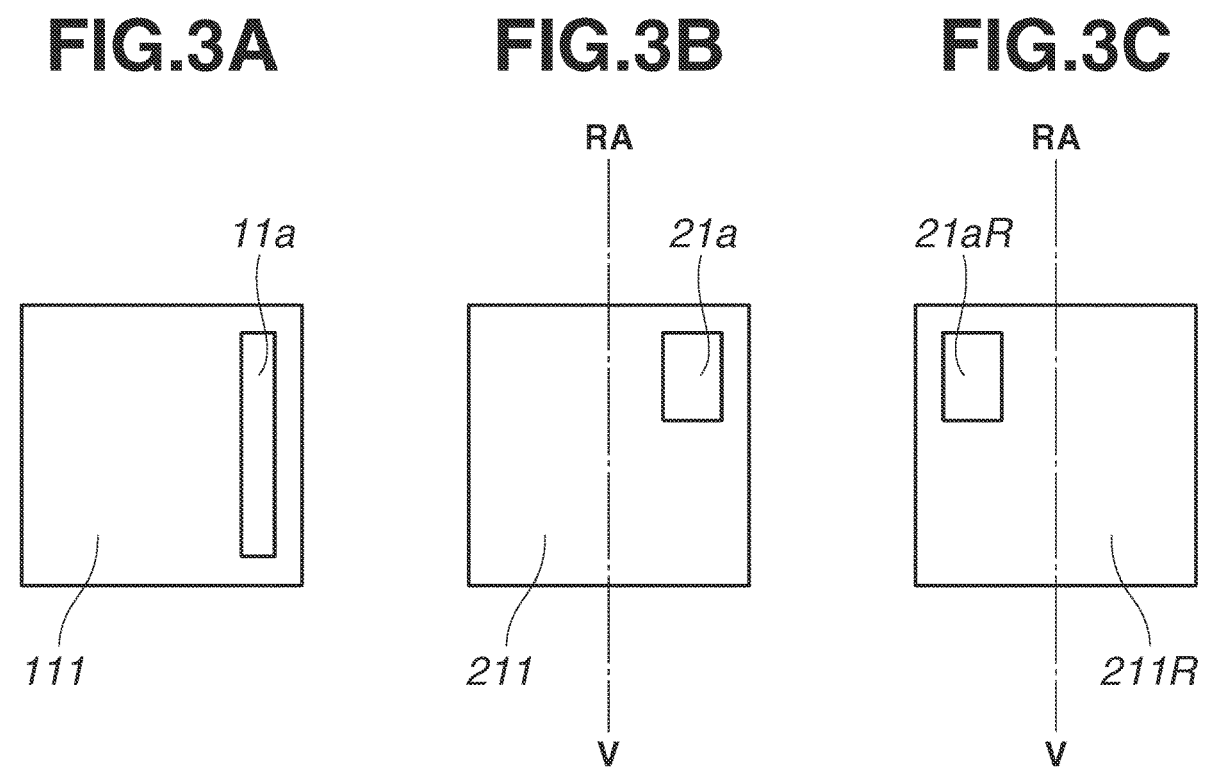

Next, in (4), a least square plane is calculated in each of the first region surface 11 and the second region surface 21, and in (5), the first region surface 11 and the second region surface 21 are converted into a height map 111 of the first region surface as illustrated in FIG. 3A and a height map 211 of the second region surface as illustrated in FIG. 3B with respect to the positions of the first region surface 11 and the second region surface 21 on the least square plane. In addition, in (6), the height map 211 of the second region surface is moved symmetrically with respect to a perpendicular plane V (here, the perpendicular plane V is a plane extending in the depth direction of the drawing) that passes through the rotation axis RA in (3) and is along a direction of 90 degrees of rotation in (3) as illustrated in FIG. 3B, and is set as a reverse height map 211R of the second region surface as illustrated in FIG. 3C, Note that, since the reverse height map 211R of the second region surface illustrated in FIG. 3C is obtained by symmetrically moving the height map 211, 21aR in the reverse height map 211R is not reversed in the height direction and is a convex portion similarly to 21a.

Figure 4:
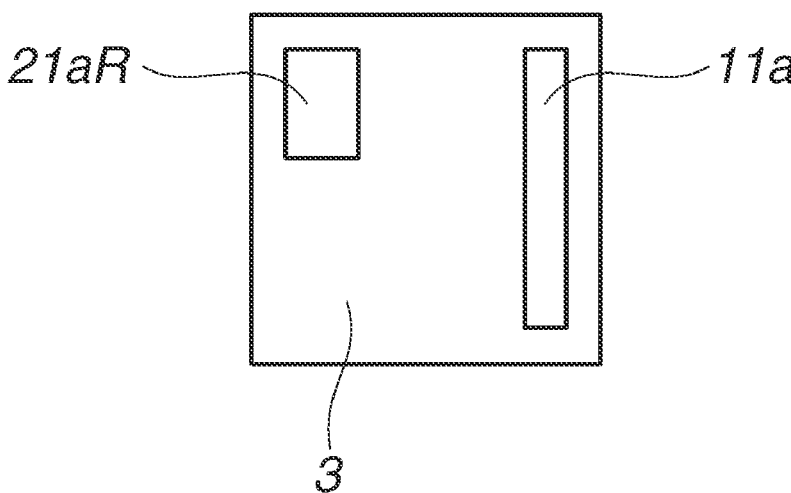
FIG. 4 is a view for explaining an aspect of the mask blanks substrate of the present invention, and is a calculation surface (a map of a calculated height) obtained from the height map of the first region surface and the reverse height map of the second region surface.

Next, in (7), the height map 111 of the first region surface illustrated in FIG. 3A and the reverse height map 211R of the second region surface illustrated in FIG. 3C are superimposed, a map of the calculated height (Z coordinate) is created by adding the height of the height map 111 of the first region surface and the height of the reverse height map 211R of the second region surface at each position (X coordinate, Y coordinate) on the reference plane S illustrated in FIG. 1A, and the obtained map of the calculated height is set as a calculation surface 3 as illustrated in FIG. 4. Then, the flatness of the calculation surface 3 is evaluated.

When the substrate of the exposure mask (mask blanks substrate) is adsorbed and held by the exposure machine, the flatness of the main surface changes according to the surface shape of the adsorption surface. In the 6025 substrate, the inside of the square of 138 mm×138 mm along the four sides of the second main surface in the central portion of the second main surface is a region of the second main surface that is actually adsorbed by the exposure machine, and the sum of the shapes of the first main surface and the second main surface in the calculation region of a regular square cylindrical shape that passes through the four sides of the square of 138 min×138 mm along the four sides of the first main surface and the second main surface and extends in the horizontal direction in the central portions of the first main surface and the second main surface, that is, the sum of the first region surface and the second region surface in the first main surface and the second main surface in the non-adsorbed state is obtained, in a manner that the shape of the first main surface in a state where the exposure mask is adsorbed and held by the exposure machine can be grasped with high accuracy.

The measurement of the shape of the main surface of the photomask blanks substrate is not particularly limited, but for example, a laser interferometer can be used. The shape that can be measured by a laser interferometer is raw data of the height map of the main surface of the substrate, and in this case, the reference of the height is a table on which the substrate is placed at the time of measurement. In the present invention, with respect to the height map of the main surface of the substrate, the least square plane of the main surface (the least square plane of the surface or the height map) is calculated and corrected to the height map based on the least square plane, removing the influence of the shape of the table on which the substrate is placed. Among the height maps corrected in this manner, in the reverse height map of the second region surface obtained by symmetrically moving the height map of the second region surface with respect to the surface passing through the rotation axis in (3) and along a 90 degree direction of rotation in (3), positive and negative in the height direction do not change, but both sides in the direction orthogonal to the rotation axis in (3) are reversed. In addition, the flatness (TIR) is a difference between a highest value (highest height) and a lowest value (lowest height) in a predetermined region of a difference between a least square plane of a target surface (surface such as the first region surface, the second region surface, and the calculation surface) and the target surface when the difference is calculated.

The flatness (TIR) of the calculation surface is 100 nm or less, preferably 50 nm or less, and more preferably 30 nm or less. When the flatness (TIR) of the calculation surface is 100 nm or less, in the exposure using the exposure mask obtained from the mask blanks substrate through the mask blanks, the exposure with good transfer accuracy can be realized. On the other hand, when the flatness (TIR) of the calculation surface is larger than 100 nm, good exposure cannot be realized.

In addition, when the calculation surface is obtained, among the shape of the second main surface, by separating the wavelength component that contributes to the shape of the first main surface and the wavelength component that does not contribute to the shape of the first main surface, the shape of the first main surface in a state where the exposure mask is adsorbed and held by the exposure machine can be grasped with higher accuracy.

Among the shape of the second main surface, the shorter wavelength component has a smaller influence on the change in the shape of the first main surface. Therefore, for example, in (5) described above, it is preferable to apply a height map obtained by processing with a Gaussian filter (20 mm×20 mm) as the height map of the second region surface. Specifically, it is preferable to apply a height map obtained by relieving a wavelength component of preferably 20 mm or less, more preferably 15 mm or less, and still more preferably 10 mm or less with a Gaussian filter.

The Gaussian filter is a smoothing processing of smoothing a minute region of a surface over the entire surface. The Gaussian filter of X mm focuses on the periphery of a certain measurement point of X mm×X mm, and uses a Gaussian distribution function to reduce the weight as the distance increases. The Gaussian filter calculates a rate based on the following formula.

$$f(x, y) = \frac{1}{2\pi\sigma^2} \exp\left(-\frac{x^2 + y^2}{2\sigma^2}\right)$$

In the present invention, by using a Gaussian filter of preferably 20 mm×20 mm, more preferably 15 mm×15 mm, and still more preferably 10 mm×10 mm, it is possible to attenuate a shape with a pitch of several mm on the second main surface, which has a small influence on the shape of the first main surface in a state where the exposure mask is adsorbed and held by the exposure machine.

In addition, since the shorter wavelength component of the shape of the second main surface has a smaller influence on the change in the shape of the first main surface, for example, in (5) described above, it is preferable to apply the height map obtained by fitting with the terms up to the 15th order, more preferably the terms up to the 21st order, and still more preferably the terms up to the 36th order of the Legendre polynomial as the height map of the second region surface. The Legendre polynomial is a polynomial that can satisfactorily fit a long-wavelength component having a large influence on the change in the shape of the first main surface among the shape of the second main surface of the mask blanks substrate, and by performing fitting with at least the terms up to the 15th order, it is possible to grasp the shape of the first main surface in a state where the exposure mask is adsorbed and held by the exposure machine with sufficiently high accuracy.

On the other hand, when the calculation surface is obtained, among the shape of the second main surface, also by separating the direction component that contributes to the shape of the first main surface and the direction component that does not contribute to the shape of the first main surface, the shape of the first main surface in a state where the exposure mask is adsorbed and held by the exposure machine can be grasped with higher accuracy. Among the shape of the second main surface, the component perpendicular to the long axis of the region where the adsorption by the exposure machine is held has a smaller influence on the change in the shape of the first main surface. Therefore, for example, in (5) described above, the height map of the second region surface is preferably a height map in which the component perpendicular to the long axis of the region where the adsorption by the exposure machine is held is excluded from the height map of the second region surface.

Next, a manufacturing step of the mask blanks substrate of the present invention is described.

A method for manufacturing a mask blanks substrate according to the present invention includes a local processing step for one or both of the first main surface and the second main surface of the mask blanks substrate, and a finish polishing step subsequent to the local processing step.

In the production of the substrate for mask blanks, before the local processing step, the glass ingot is cut into the shape of the mask blanks substrate, and then the outer shape processing, the end surface, and the main surface are roughly polished. The polishing in each of these steps is often configured in several stages, and is not particularly limited, but for example, an aqueous solution of cerium oxide or silica nanoparticles of 10 to 100 nm is used as a polishing agent.

Next, local processing of adjusting the shape of the main surface is performed, and in the local processing step, processing of selectively removing a relatively convex portion is performed on one or both of the first main surface and the second main surface of the mask blanks substrate. In this step, the processing can be repeated until a predetermined shape is obtained. For the local processing, a method such as magneto-rheological finishing (MRF) can be used. However, in general, a surface defect level obtained only by local processing may not be sufficient particularly in a mask blanks substrate for state-of-the-art products, and thus a finish polishing step is performed following the local processing step.

A local processing step of the method for manufacturing a mask blanks substrate according to the present invention includes (A) a step of grasping a change in shapes of the surfaces before and after the finish polishing step of the first main surface and the second main surface, (B) a step of locally processing one or both of the first main surface and the second main surface, (C) a step of measuring the shape of the first main surface and the shape of the second main surface after the step (B) as the shape of the surfaces before the finish polishing step, (D) a step of predicting the shapes of the first main surface and the second main surface after the finish polishing step by applying the change in the shapes of the surfaces is grasped in the step (A) to the shapes of the surfaces before the finish polishing step obtained in the step (C), and (E) a step of evaluating whether or not the shapes of the first main surface and the second main surface predicted in the step (D) are shapes of the first main surface and the second main surface satisfying predetermined flatness.

The shape of the surface obtained only by the local processing is not flat, and usually has a shape (in general, a middle convex shape (a shape in which the central portion of the main surface protrudes), a middle concave shape (a shape in which the central portion of the main surface is recessed), or the like) that cancels the change in the shape of the surface in the finish polishing step performed after that. Even if the flatness (TIR) of the shape of the surface obtained only by the local processing is evaluated, the evaluation deviates from the evaluation result of the shape of the main surface of the mask blanks substrate that is finally obtained. The change in the shape of the main surface occurring in the finish polishing step performed under a predetermined polishing condition after the local processing step is reproducible, and the change in the shape of the main surface after the finish polishing under a predetermined polishing condition is grasped, and the change is applied to the shape of the main surface after the local processing to predict the shape of the surface after the finish polishing step performed under a predetermined polishing condition. Thus, the shape of the surface obtained after the finish polishing can be evaluated at the stage of the local processing before the finish polishing, and the quality of the shape of the main surface obtained by the finish polishing can be evaluated. Therefore, in the method for manufacturing the mask blanks substrate of the present invention, it is preferable to manufacture the mask blanks substrate by a local processing step including the above steps (A) to (E).

In the step (A), the change in the shape of the surface after the finish polishing step with respect to the surface after the local processing step of the first main surface and the second main surface is grasped. For example, this change can be grasped from the shape of the main surface obtained by selecting another mask blanks substrate having the same shape as the main surface from the mask blanks substrate subjected to the local processing and performing predetermined finish polishing on this another mask blanks substrate. In addition, the change in the shape can also be estimated by simulation. In this case, as another mask blanks substrate, a substrate in which the shape of the main surface is a middle concave shape that is the target shape in the local processing step, a substrate in which the flatness (TIR) of the main surface is less than 300 nm, or the like are suitable. The step (A) may be performed after the step (B) or after the step (C).

In the step (B), one or both of the first main surface and the second main surface are locally processed, but in the local processing, a predetermined processing condition in the local processing is set in a manner that the first main surface and the second main surface have a predetermined shape in consideration of the shapes of the first main surface and the second main surface before and after the local processing and the change in the shape of the surface after the finish polishing step. Specifically, for example, in a case where the second main surface is convex, the first main surface is preferably concave in a manner that the first main surface is flat when the exposure mask is adsorbed and held by the exposure machine, and in a case where the second main surface is concave, the first main surface is preferably convex in a manner that the first min surface is flat when the exposure mask is adsorbed and held by the exposure machine. On the other hand, when the shape changes to be convex by finish polishing, the first main surface preferably has a shape (for example, a low convex shape or a concave shape) that cancels this change in consideration of this change, and when the shape changes to be concave by finish polishing, the first main surface preferably has a shape (for example, a shallow concave shape or a convex shape) that cancels this change in consideration of this change.

In the step (C), the shape of the first main surface and the shape of the second main surface after the step (B), that is, after actual local processing are measured as the shape of the surface before the finish polishing step, but this measurement is not particularly limited, and for example, a laser interferometer can be used. In addition, the shape of the first main surface and the shape of the second main surface are appropriately measured even before the local processing, but the measurement is not particularly limited, and for example, a laser interferometer can be used.

In the step (D), the change in the shape of the main surface grasped in the step (A) is applied to the shape of the main surface obtained in the step (C) to predict the shapes of the first main surface and the second main surface after the finish polishing step, and the change in the shape of the main surface grasped in the step (A) is selected according to the shape of the main surface after local processing obtained in the step (C). Here, for example, when the shapes of the main surfaces of the first main surface and the second main surface after the local processing step are denoted by $S11a$ and $S11b$, respectively, and shape changes of the first main surface and the second main surface when predetermined finish polishing is performed are measured and denoted by $S\Delta a$ and $S\Delta b$, respectively, the following formulas (a) and (b) are obtained.

$$S11a + S\Delta a = S12a \qquad \text{(a)}$$

$$S11b + S\Delta b = S12b \qquad \text{(b)}$$

Thus, the shape ($S12a$) of the first main surface and the shape ($S12b$) of the second main surface after the finish polishing step can be predicted.

In the step (E), it is evaluated whether or not the shapes of the first main surface and the second main surface predicted in the step (D) are shapes of the first main surface and the second main surface satisfying predetermined flatness. As this evaluation method, a method including measurement of the shape of the main surface and its numerical analysis can be used.

Specifically, for example, the shapes of the first main surface and the second main surface satisfying the predetermined flatness in the step (E) can be evaluated as the shapes having the flatness (TIR) of the calculation surface of 100 nm or less when (1) the first main surface and the second main surface of the substrate are arranged along a substantially vertical direction and a calculation region of a regular square cylindrical shape extending in a horizontal direction through four sides of a 138 mm×138 mm square along four sides of the first main surface and the second main surface is set in a central portion of the first main surface and the second main surface, (2) a portion in the calculation region is cut out from the first main surface in a state of facing the first main surface to obtain a first region surface, (3) a vertical plane passing through a reference point that is an arbitrary point on a central axis of a regular square cylinder of the calculation region and orthogonal to the central axis is set as a reference plane, a rotation axis passing through the reference point and parallel to any one side of four sides of a regular square that is an intersection line between the regular square cylinder of the calculation region and the vertical plane is set, and a portion in the calculation region is cut out from the second main surface in a state of facing the second main surface by rotating the substrate 180 degrees along the rotation axis from a state of facing the first main surface, to obtain a second region surface, (4) a least square plane in each of the first region surface and the second region surface is calculated, (5) the first region surface and the second region surface are converted into a height map of the first region surface and a height map of the second region surface with respect to respective positions of the first region surface and the second region surface on a least square plane, (6) the height map of the second region surface is set as a reverse height map of the second region surface by symmetrically moving the height map with respect to a perpendicular plane along a 90 degree direction of the rotation in (3) passing through the rotation axis in (3), and (7) a map of a calculated height (Z coordinate) is created by adding a height of the height map of the first region surface and a height of the reverse height map of the second region surface at each position (X coordinate and Y coordinate) on the reference plane, and the map of the calculated height is set as the calculation surface. In this way, the flatness of the exposure mask at the time of exposure using the exposure mask obtained from the mask blanks substrate through the mask blanks can be predicted with extremely high accuracy at the stage of the mask blanks substrate, and the flatness of the exposure mask at the time of exposure using the exposure mask can be predicted.

In this case, from the shape of the first main surface (S12a) and the shape of the second main surface (S12b) described above, in the above (5), as shown in the following formula (c), a calculation surface (S13) can be obtained by integrating the shape of the first main surface and the shape of the second main surface.

$$S12a+S12b=S13 \qquad \text{(c)}$$

Then, the flatness (TIR) of the mask blanks substrate finally obtained after the finish polishing can be predicted from the flatness (TIR) of the obtained calculation surface.

In the step (E), when the shapes of the first main surface and the second main surface predicted in the step (D) are the shapes of the first main surface and the second main surface satisfying the predetermined flatness, the process can proceed to the finish polishing step. On the other hand, in step (E), when the shapes of the first main surface and the second main surface predicted in step (D) are not the shapes of the first main surface and the second main surface satisfying the predetermined flatness, steps (A) to (E) can be repeated.

The shape of the first main surface and the shape of the second main surface of the mask blanks substrate finally obtained after finish polishing can also be appropriately measured, and this measurement is not particularly limited, but for example, a laser interferometer can be used. Furthermore, from the result, the flatness (TIR) of the mask blanks substrate finally obtained after finish polishing can also be evaluated.

The surface of the mask blanks substrate after the local processing often has an insufficient surface state in terms of defects and roughness, and in order to improve them, finish polishing is performed after the local processing. For example, the finish polishing can be performed by double-sided simultaneous polishing using, a soft polishing cloth and a polishing slurry composed of fine colloidal silica. The polishing conditions for finish polishing can be appropriately selected according to a conventional method, and are not particularly limited, but for example, suede type soft polisher and an aqueous solution of colloidal silica abrasive grains having an average particle diameter of 10 to 100 nm can be used.

EXAMPLES

Hereinafter, the present invention is specifically described with reference to Examples, but the present invention is not limited to the following Examples.

Examples 1 to 3

Ten glass substrates (the size of the first main surface and the second main surface was 152 mm×152 mm square, and the thickness was 6.35 mm) formed of $SiO_2$ and $TiO_2$ ($TiO_2$ concentration: about 7 wt %) were prepared. The end surface (four surfaces other than the main surface) of the glass substrate was subjected to chamfering and grinding, and further subjected to rough polishing processing and precision polishing with a polishing liquid containing cerium oxide abrasive grains. After that, ten glass substrates (substrates 1-1 to 1-10) in Example 1, ten glass substrates (substrates 2-1 to 2-10) in Example 2, and 10 glass substrates (substrates 3-1 to 3-10) in Example 3 were set in a carrier of a double-side polishing apparatus to which a suede type soft polisher was applied, and the first main surface and the second main surface were ultra-precisely polished using a polishing liquid of colloidal silica abrasive grains.

After the ultra-precise polishing, the silica nanoparticles were removed by washing with a washing liquid containing KOH, and after drying, the shapes of the first main surface and the second main surface were measured with a surface shape measuring apparatus (UltraFlat, manufactured by Tropel Corporation). After that, based on the shape of the obtained main surface, the processing conditions of the local processing to be performed next were determined.

Next, both surfaces of the glass substrate were locally processed by a local processing apparatus based on the determined processing conditions. As the local processing apparatus, a local processing apparatus described in JP-A 2010-194705 (Patent Document 3) was used. The local processing using this device polishes the entire surface of the substrate while controlling the moving speed of the fine polishing tool, and the target shape can be obtained by slowly moving the polishing tool in the relatively convex portion and rapidly moving the polishing tool in the relatively concave portion. As a processing tool of the local processing apparatus, wool felt buffs were used, and as a polishing slurry, silica nanoparticles (AJ-3540, manufactured by Nissan Chemical Corporation) mixed with a small amount of defoaming agent (Shin-Etsu Silicone KS-537, manufactured by Shin-Etsu Chemical Co., Ltd.) were used. The glass substrate after the local processing was washed with a washing liquid containing KOH to remove silica nanoparticles, dried, and then the shapes of the first main surface and the second main surface were measured with a surface shape measuring apparatus (UltraFlat, manufactured by Tropel Corporation).

Here, in order to grasp the change in the shape of the main surface after finish polishing with respect to the surface after the local processing, another glass substrate was used to perform local processing similarly, and the change in the shape of the main surface after finish polishing with respect to the surface after the local processing was evaluated by performing finish polishing similar to the finish polishing described later. Next, for the glass substrate, the shape of the surface after finish polishing was predicted by applying the grasped change in the shape of the main surface to the shape of the main surface of the glass substrate after local processing. In this Example, after the shape of the surface after the finish polishing was predicted for the surface after the first local processing, the second local processing was performed for each of the ten glass substrates, and the shape of the surface after the finish polishing step was predicted also for the surface after the second local processing.

Next, with respect to the actually measured shape of the surface after local polishing and the predicted shape of the surface after finish polishing, the shape of the main surface of the glass substrate was evaluated as the flatness (TIR) by the following method. That is, the flatness (TIR) of the calculation surface was obtained when (1) the first main surface and the second main surface of the substrate are arranged along a substantially vertical direction and a calculation region of a regular square cylindrical shape extending in a horizontal direction through four sides of a 138 mm×138 mm square along four sides of the first main surface and the second main surface is set in a central portion of the first main surface and the second main surface, (2) a portion in the calculation region is cut out from the first main surface in a state of facing the first main surface to obtain a first region surface, (3) a vertical plane passing through a reference point that is an arbitrary point on a central axis of a regular square cylinder of the calculation region and orthogonal to the central axis is set as a reference plane, a rotation axis passing through the reference point and parallel to any one side of four sides of a regular square that is an intersection line between the regular square cylinder of the calculation region and the vertical plane is set, and a portion in the calculation region is cut out from the second main surface in a state of facing the second main surface by rotating the substrate 180 degrees along the rotation axis from a state of facing the first main surface, to obtain a second region surface, (4) a least square plane in each of the first region surface and the second region surface is calculated, (5) the first region surface and the second region surface are converted into a height map of the first region surface and a height map of the second region surface with respect to respective positions of the first region surface and the second region surface on a least square plane, to (6) the height map of the second region surface is set as a reverse height map of the second region surface by symmetrically moving the height map with respect to a perpendicular plane along a 90 degree direction of the rotation in (3) passing through the rotation axis in (3), and (7) a map of a calculated height (Z coordinate) is created by adding a height of the height map of the first region surface and a height of the reverse height map of the second region surface at each position (X coordinate and Y coordinate) on the reference plane, and the map of the calculated height is set as the calculation surface. In Example 1, the surface obtained by cutting out the surface of the second region is used as the second region surface as it is, in Example 2, the height map obtained by processing with the Gaussian filter (20 mm×20 mm) is applied as the height map of the second region surface in (5), and in Example 3, the height map obtained by fitting with the terms up to the 15th order of the Legendre polynomial is applied as the height map of the second region surface in (5). The results are shown in Table 1.

Figure 5:
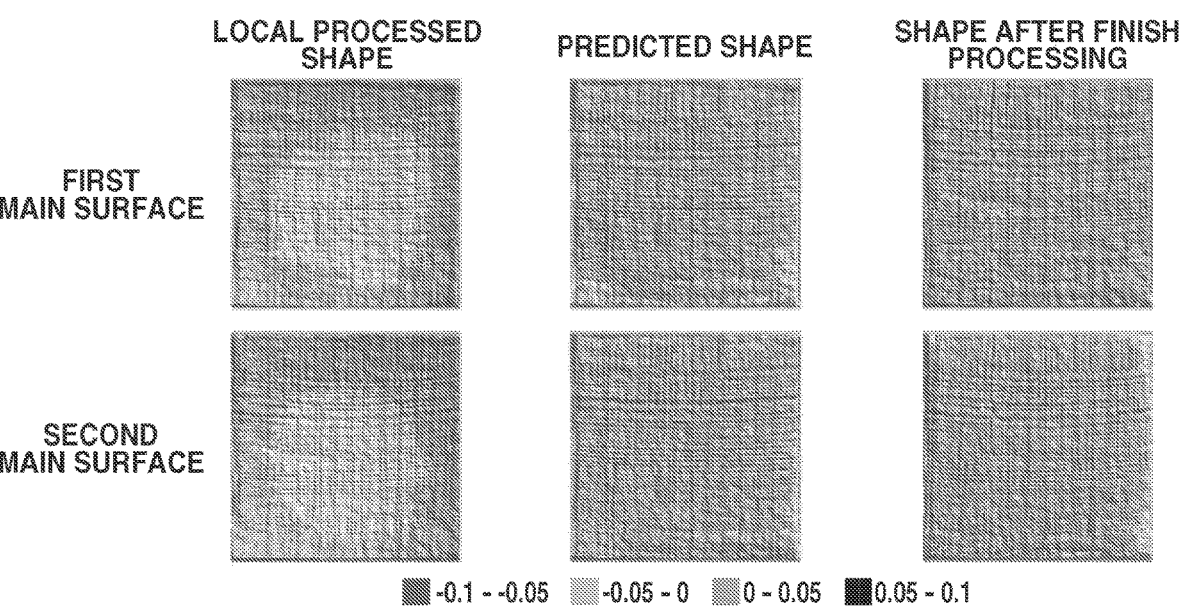
FIG. 5 is a view illustrating the shapes of the first main surface and the second main surface after second local processing, the shapes of the first main surface and the second main surface after the finish polishing step predicted by applying the grasped change in the shape of the main surface, and the shapes of the first main surface and the second main surface after the finish polishing in Example 1 (substrate 1-1).

In addition, for the substrate 1-1, the shapes of the first main surface and the second main surface after the second local processing (local processed shape) and the shapes of the first main surface and the second main surface after the finish polishing step predicted by applying the grasped change in the shape of the main surface (predicted shape) are shown in FIG. 5. In this case, since the shape of the first main surface after the finish polishing step is a convex shape, in the substrate 1-1, it is preferable to perform local processing in a manner that the shape of the first main surface becomes a concave shape after the local processing, and in the substrate 1-1, the local processing was performed as described above.

In the measurement of the shape of the main surface of the glass substrate, the shapes of the first main surface and the second main surface are both measured from the outside of the glass substrate with the measuring instrument facing the first main surface and the second main surface.

TABLE 1

| | TIR (in a 138 mm square) [nm] | | |
| | Before local | After local processing | |
| Substrate | processing (after actual measurement) | First time After prediction | Second time after finish polishing |
| --- | --- | --- | --- |
| 1-1 | 126 | 45.9 | 30.1 |
| 1-2 | 154 | 52.1 | 26.8 |
| 1-3 | 223 | 83.9 | 40.1 |
| 1-4 | 176 | 126.3 | 34.0 |
| 1-5 | 162 | 90.4 | 29.6 |
| 1-6 | 166 | 33.3 | 32.7 |
| 1-7 | 212 | 33.8 | 38.4 |
| 1-8 | 215 | 48.0 | 37.5 |
| 1-9 | 246 | 30.6 | 35.1 |
| 1-10 | 186 | 32.8 | 30.8 |
| 2-1 | 114 | 42.4 | 26.0 |
| 2-2 | 143 | 49.8 | 19.0 |
| 2-3 | 207 | 81.4 | 30.6 |
| 2-4 | 160 | 116.5 | 32.2 |
| 2-5 | 157 | 93.6 | 27.2 |
| 2-6 | 158 | 29.6 | 31.3 |
| 2-7 | 195 | 29.2 | 34.8 |
| 2-8 | 202 | 38.4 | 35.6 |
| 2-9 | 217 | 25.2 | 31.2 |
| 2-10 | 166 | 30.2 | 27.6 |
| 3-1 | 107 | 43.2 | 25.9 |
| 3-2 | 132 | 48.8 | 18.2 |
| 3-3 | 208 | 78.6 | 33.6 |
| 3-4 | 143 | 118.0 | 31.6 |
| 3-5 | 146 | 99.6 | 27.3 |
| 3-6 | 161 | 28.8 | 31.7 |
| 3-7 | 183 | 27.7 | 35.8 |
| 3-8 | 191 | 39.0 | 34.7 |
| 3-9 | 215 | 24.1 | 33.8 |
| 3-10 | 175 | 31.5 | 28.5 |

As a result, since the predicted flatness (TIR) of the shape of the main surface after finish polishing with respect to the surface after the second local processing was 100 nm or less in any of the glass substrates, finish polishing was performed.

The finish polishing was performed in two stages. First, in order to remove scratches generated by local processing, ten glass substrates were set on a carrier of a double-side polishing apparatus to which suede type soft polisher was applied, the first main surface and the second main surface were ultra-precisely polished using a polishing liquid of colloidal silica abrasive grains, and after the ultra-precision polishing, silica nanoparticles were removed by washing with a washing liquid containing KOH. Next, ten glass substrates were set in a carrier of a double-side polishing apparatus to which a suede type soft polisher was applied, and the first main surface and the second main surface were finally polished using a polishing liquid of colloidal silica abrasive grains wider a condition different from the ultra-precision polishing. The glass substrate after the final polishing was washed with a washing liquid containing KOH to remove silica nanoparticles, dried, and then the shapes of the first main surface and the second main surface were measured with a surface shape measuring apparatus (UltraFlat, manufactured by Tropel Corporation).

Next, with respect to the shape of the surface after finish polishing, the shape of the main surface of the glass substrate was evaluated as the flatness (TIR) in the same manner as the method for evaluating the flatness (TIR). The results are shown in Table 2. In addition, the shapes of the first main surface and the second main surface (shape after finish processing) of the substrate 1-1 after finish polishing are shown in FIG. 5.

TABLE 2

| Substrate | TIR (in a 138 mm square) [nm] After finish polishing (after actual measurement) |
| --- | --- |
| 1-1 | 43 |
| 1-2 | 37 |
| 1-3 | 52 |
| 1-4 | 51 |
| 1-5 | 42 |
| 1-6 | 60 |
| 1-7 | 66 |
| 1-8 | 61 |
| 1-9 | 54 |
| 1-10 | 53 |
| 2-1 | 34 |
| 2-2 | 30 |
| 2-3 | 46 |
| 2-4 | 46 |
| 2-5 | 38 |
| 2-6 | 53 |
| 2-7 | 61 |
| 2-8 | 56 |
| 2-9 | 51 |
| 2-10 | 47 |
| 3-1 | 34 |
| 3-2 | 31 |
| 3-3 | 50 |
| 3-4 | 48 |
| 3-5 | 39 |
| 3-6 | 54 |
| 3-7 | 63 |
| 3-8 | 58 |
| 3-9 | 54 |
| 3-10 | 48 |

From the above results, it can be seen that there is no large difference between the flatness (TIR) of the shapes of the first main surface and the second main surface after the finish polishing step predicted by applying the grasped change in the shape of the main surface and the actual flatness (TIR) of the shapes of the first main surface and the second main surface after the finish polishing, and the flatness (TIR) predicted after the local processing can be applied to the determination of the possibility of the shape of the main surface after the local processing. In addition, the photomask blanks substrate obtained in this Example has the flatness (TIR) of about 50 nm after finish polishing, and thus can be favorably used as a mask blanks substrate to provide an exposure mask in which a main surface of the substrate has a highly flat shape when adsorbed and held by an exposure machine in exposure using an exposure mask, in particular, exposure by EUVL.

Japanese Patent Application No. 2021-120239 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for manufacturing a mask blank substrate having two main surfaces of a first main surface and a second main surface of 152 mm×152 mm square and having a thickness of 6.35 mm, the method comprising:
   a local processing step for one or both of the first main surface and the second main surface; and
   a finish polishing step subsequent to the local processing step,
   wherein the local processing step includes:

(A) a step of estimation of a change in the shapes of the surfaces before and after the finish polishing step of the first main surface and the second main surface by simulation or measurement of the change in the shapes of the surfaces before and after the finish polishing step of the first main surface and the second main surface on another, previously processed substrate;

(B) a step of locally processing one or both of the first main surface and the second main surface;

(C) a step of measuring the shape of the first main surface and the shape of the second main surface after the step (B) as the shape of the surfaces before the finish polishing step;

(D) a step of predicting the shapes of the first main surface and the second main surface after the finish polishing step based upon the estimation of the change in the shapes of the surfaces before and after the finish polishing step of the first main surface and the second main surface of the step (A) to the shapes of the surfaces before the finish polishing step obtained in the step (C); and (E) a step of determining if the process is complete by determining if the shapes of the first main surface and the second main surface predicted in the step (D) have a flatness (TIR) of 50 nm or less, and
wherein the shapes of the first main surface and the second main surface in the step (E) are determined to have the flatness (TIR) of the calculation surface of 50 nm or less by the following steps of:

(1) arranging the first main surface and the second main surface of the substrate along a substantially vertical direction, and setting a calculation region of a square shape extending in a horizontal direction through four sides of a 138 mm×138 mm square along four sides of the first main surface and the second main surface in a central portion of the first main surface and the second main surface;

(2) cutting out a portion in the calculation region from the first main surface in a state of facing the first main surface to obtain a first region surface;

(3) setting a vertical plane passing through a reference point that is an arbitrary point on a central axis of a square shape of the calculation region and orthogonal to the central axis as a reference plane, setting a rotation axis passing through the reference point and parallel to any one side of four sides of a regular square that is an intersection line between the square shape of the calculation region and the vertical plane, and cutting out a portion in the calculation region from the second main surface in a state of facing the second main surface by rotating the substrate 180 degrees along the rotation axis from a state of facing the first main surface, to obtain a second region surface;

(4) calculating a least square plane in each of the first region surface and the second region surface;

(5) converting the first region surface and the second region surface into a height map of the first region surface and a height map of the second region surface with respect to respective positions of the first region surface and the second region surface on the respective least square planes, where the height map of the second region surface is obtained by applying a Gaussian filter (20 mm×20 mm) to separate a wavelength component that contributes to the shape of the first main surface and a wavelength component that does not contribute to the shape of the first main surface from each other;

(6) setting the height map of the second region surface as a reverse height map of the second region surface by symmetrically moving the height map with respect to a perpendicular plane passing through the rotation axis and along a 90 degree direction of the rotation; and (7) creating a map of a calculated height (Z coordinate) by adding a height of the height map of the first region surface and a height of the reverse height map of the second region surface at each position (X coordinate and Y coordinate) on the reference plane, and defining the map of the calculated height as the calculation surface.

2. The manufacturing method according to claim 1, wherein in the step (E), in a case where the shapes of the first main surface and the second main surface predicted in the step (D) are not the shapes of the first main surface and the second main surface satisfying the predetermined flatness, the steps (A) to (E) are repeated.

3. The manufacturing method according to claim 1, wherein the flatness (TIR) of the calculation surface is 30 nm or less.

4. The manufacturing method according to claim 3, wherein the flatness (TIR) in the step (E) is 30 nm or less.

5. A method for manufacturing a mask blank substrate having two main surfaces of a first main surface and a second main surface of 152 mm×152 mm square and having a thickness of 6.35 mm, the method comprising:

a local processing step for one or both of the first main surface and the second main surface; and a finish polishing step subsequent to the local processing step, wherein the local processing step includes:

(A) a step of estimation of a change in the shapes of the surfaces before and after the finish polishing step of the first main surface and the second main surface by simulation or measurement of the change in the shapes of the surfaces before and after the finish polishing step of the first main surface and the second main surface on another, previously processed substrate;

(B) a step of locally processing one or both of the first main surface and the second main surface;

(C) a step of measuring the shape of the first main surface and the shape of the second main surface after the step (B) as the shape of the surfaces before the finish polishing step;

(D) a step of predicting the shapes of the first main surface and the second main surface after the finish polishing step based upon the estimation of the change in the shapes of the surfaces before and after the finish polishing step of the first main surface and the second main surface of the step (A) to the shapes of the surfaces before the finish polishing step obtained in the step (C); and (E) a step of determining if the process is complete by determining if the shapes of the first main surface and the second main surface predicted in the step (D) have a flatness (TIR) of 50 nm or less, and wherein the shapes of the first main surface and the second main surface in the step (E) are determined to have the flatness (TIR) of the calculation surface of 50 nm or less by the following steps:

(1) arranging the first main surface and the second main surface of the substrate along a substantially vertical direction, and setting a calculation region of a square shape extending in a horizontal direction through four sides of a 138 mm×138 mm square along four sides of the first main surface and the second main surface in a central portion of the first main surface and the second main surface;

(2) cutting out a portion in the calculation region from the first main surface in a state of facing the first main surface to obtain a first region surface;

(3) setting a vertical plane passing through a reference point that is an arbitrary point on a central axis of a square shape of the calculation region and orthogonal to the central axis as a reference plane, setting a rotation axis passing through the reference point and parallel to any one side of four sides of a regular square that is an intersection line between the square shape of the calculation region and the vertical plane, and cutting out a portion in the calculation region is from the second main surface in a state of facing the second main surface by rotating the substrate 180 degrees along the rotation axis from a state of facing the first main surface, to obtain a second region surface;

(4) calculating a least square plane in each of the first region surface and the second region surface;

(5) converting the first region surface and the second region surface into a height map of the first region surface and a height map of the second region surface with respect to respective positions of the first region surface and the second region surface on the respective least square planes, where the height map of the second region surface is obtained by fitting with terms up to a 15th order of a Legendre polynomial to separate a wavelength component that contributes to the shape of the first main surface and a wavelength component that does not contribute to the shape of the first main surface from each other;

(6) setting the height map of the second region surface as a reverse height map of the second region surface by symmetrically moving the height map with respect to a perpendicular plane passing through the rotation axis and along a 90 degree direction of the rotation; and (7) creating a map of a calculated height (Z coordinate) by adding a height of the height map of the first region surface and a height of the reverse height map of the second region surface at each position (X coordinate and Y coordinate) on the reference plane, and defining the map of the calculated height as the calculation surface.

6. The manufacturing method according to claim 5, wherein in the step (E), in a case where the shapes of the first main surface and the second main surface predicted in the step (D) are not the shapes of the first main surface and the second main surface satisfying the predetermined flatness, the steps (A) to (E) are repeated.

7. The manufacturing method according to claim 5, wherein the flatness (TIR) of the calculation surface is 30 nm or less.

8. The manufacturing method according to claim 7, wherein the flatness (TIR) in the step (E) is 30 nm or less.

* * * * *